United States Patent [19]
Yoshihara

[11] Patent Number: 5,789,285
[45] Date of Patent: Aug. 4, 1998

[54] MANUFACTURING METHOD FOR BIMOS

[75] Inventor: Ikuo Yoshihara, Kanagawa, Japan

[73] Assignee: Sony Corporation, Japan

[21] Appl. No.: 720,011

[22] Filed: Sep. 27, 1996

Related U.S. Application Data

[62] Division of Ser. No. 505,787, Jul. 21, 1995, abandoned.

[30] Foreign Application Priority Data

Jul. 29, 1899 [JP] Japan ................... 6-197763

[51] Int. Cl.$^6$ ................................ H01L 21/8238
[52] U.S. Cl. ............. 430/202; 438/234; 438/309; 438/320; 438/339; 438/366; 148/DIG. 9
[58] Field of Search ............... 438/202, 234, 438/309, 320, 339, 364, 366; 148/DIG. 9, DIG. 10, DIG. 11

[56] References Cited

U.S. PATENT DOCUMENTS

| | | | |
|---|---|---|---|
| 4,994,400 | 2/1991 | Yamaguchi et al. | 148/DIG. 11 |
| 5,091,322 | 2/1992 | Maeda et al. | 148/DIG. 9 |
| 5,132,234 | 7/1992 | Kim et al. | 148/DIG. 9 |
| 5,202,273 | 4/1993 | Nakamura | 437/40 |
| 5,204,276 | 4/1993 | Nakajima | 148/DIG. 9 |
| 5,319,234 | 6/1994 | Uga et al. | |
| 5,324,672 | 6/1994 | Anmo et al. | |
| 5,403,758 | 4/1995 | Yoshihara | |
| 5,439,833 | 8/1995 | Hebert et al. | 148/DIG. 9 |
| 5,541,124 | 7/1996 | Miwa et al. | 148/DIG. 11 |
| 5,604,374 | 2/1997 | Inou et al. | 257/593 |

FOREIGN PATENT DOCUMENTS

| | | |
|---|---|---|
| 339 637 | 11/1989 | European Pat. Off. . |
| 495 329 | 7/1992 | European Pat. Off. . |
| 42 30 858 | 8/1993 | Germany . |
| 0 435 257 | 7/1991 | Japan . |
| 6-77418 | 3/1994 | Japan . |
| 6-181 292 | 6/1994 | Japan . |

OTHER PUBLICATIONS

Riseman, J., "Formation of Submicron Grooves in Silicon", IBM Technical Disclosure Bulletin, vol. 26, No. 7A, Dec. 1983.

*Primary Examiner*—John Niebling
*Assistant Examiner*—Long Pham
*Attorney, Agent, or Firm*—Ronald P. Kananen

[57] ABSTRACT

In a BiMOS semiconductor device, emitter and base electrodes formed by polycrystalline Si of a bipolar transistor are isolated from each other by way of a sidewall and an insulator layer. As this insulator layer acts as an offset during the formation of the sidewall, its layer thickness can be made larger. Further, as this insulator layer is not provided in a MOS region, its step can be made smaller. Consequently, parasitic capacitance can be reduced while the insulator layer can be made thicker. Thus, there can be achieved both fast operation and high reliability of the bipolar transistor and, moreover, reduction in the reliability of a MOS transistor can also be prevented.

9 Claims, 8 Drawing Sheets

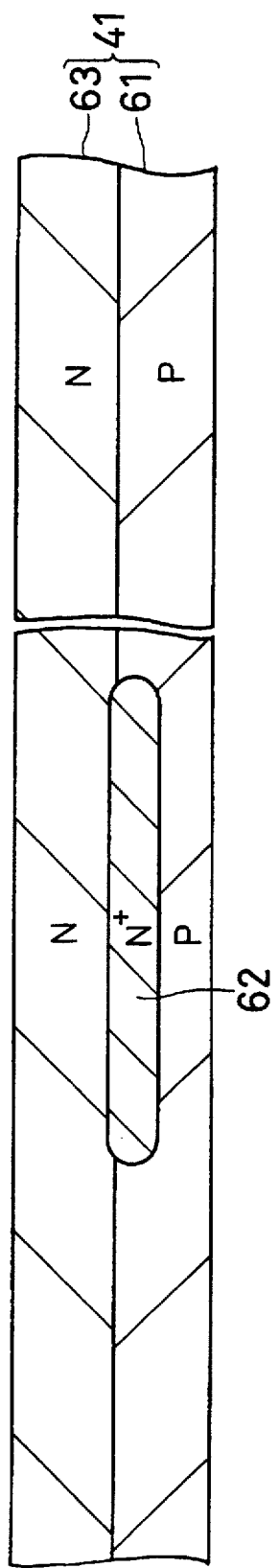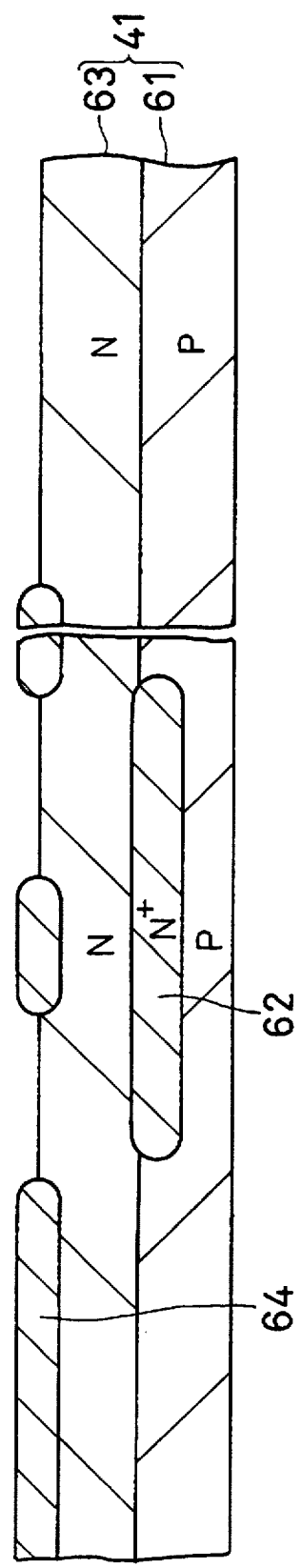

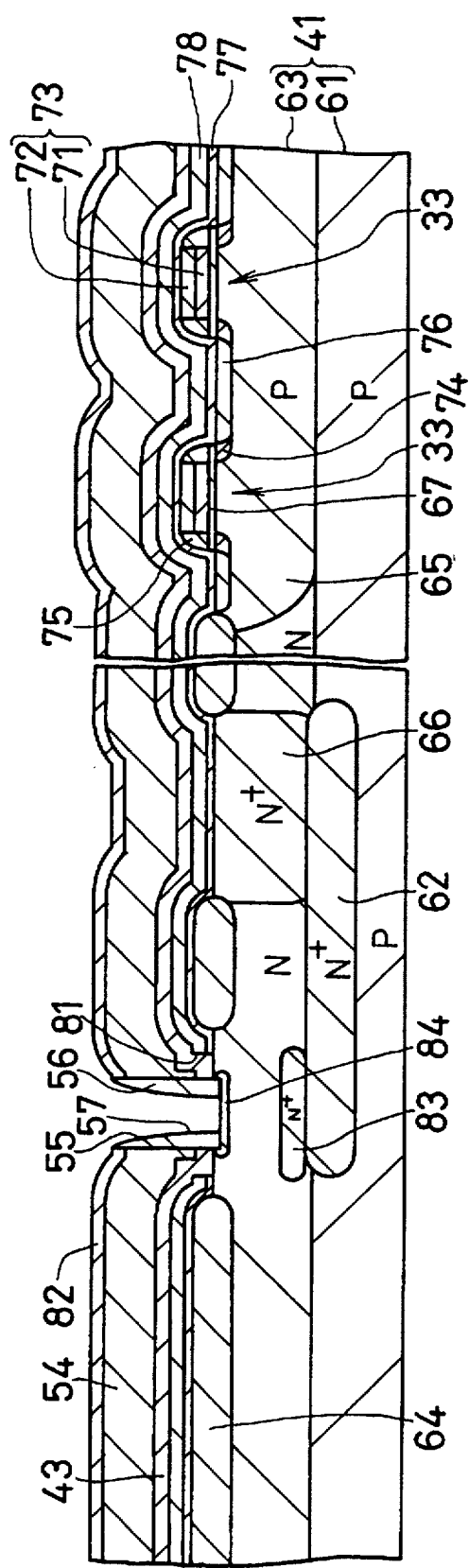
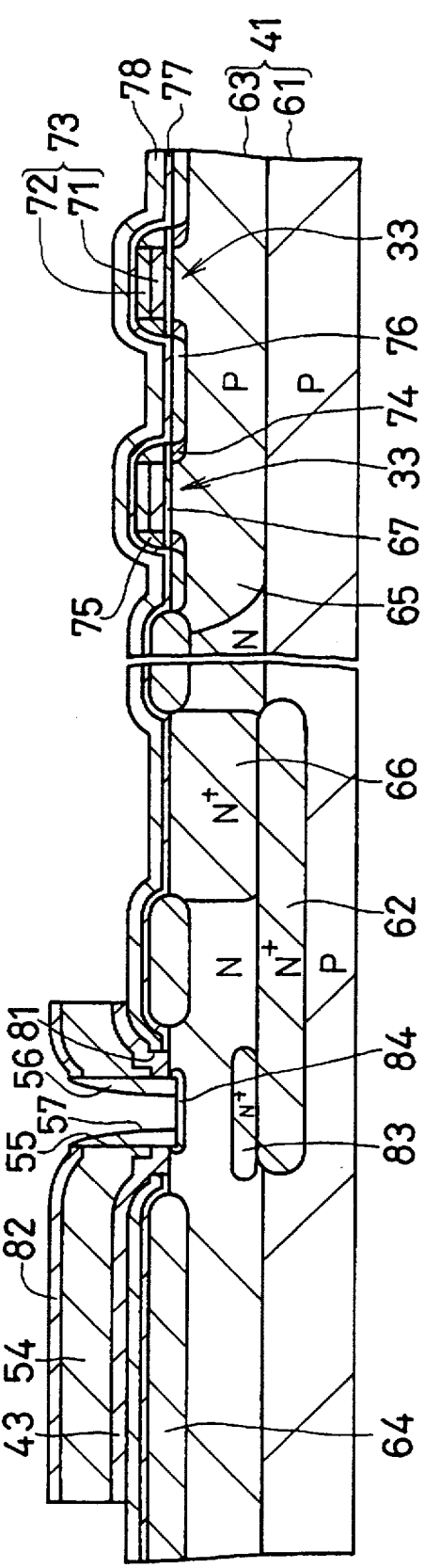
FIG.3G
FIG.3H

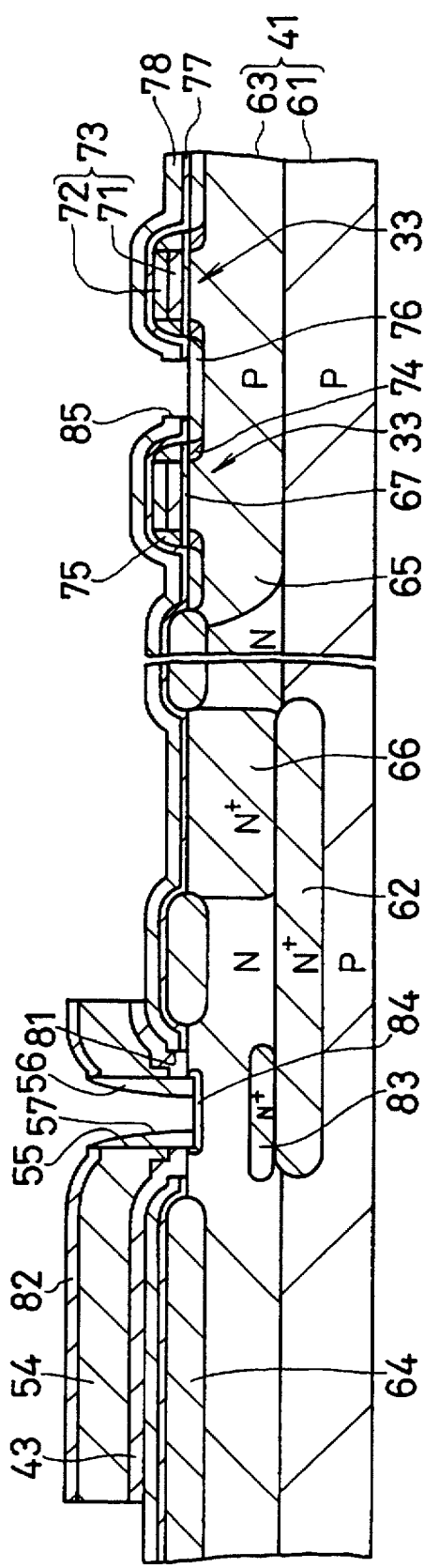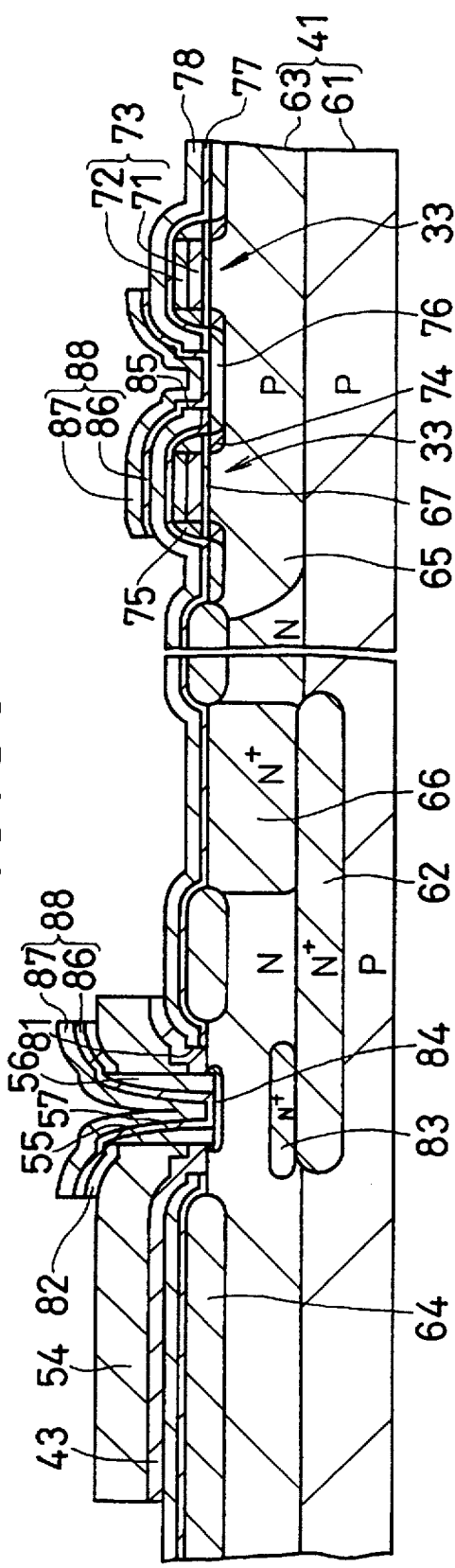

MANUFACTURING METHOD FOR BiMOS

This application is a division of application Ser. No. 08/505,787 filed Jul. 21, 1995 now abandoned.

BACKGROUND OF THE INVENTION

1. Field of the Invention

The invention of the present application relates to a BiMOS semiconductor device comprising a bipolar transistor and a MOS transistor on a same semiconductor base, and a manufacturing method thereof.

2. Description of the Related Art

FIG. 1 shows, as a related art of the invention of the present application, a TFT load type BiCMOS-SRAM (see TECHNICAL REPORT OF THE INSTITUTE OF ELECTRONICS INFORMATION AND COMMUNICATION ENGINEERS, SDM93-151 CD93-145(1993-11)). This BiCMOS-SRAM has a memory portion 1 and a peripheral circuit portion 2.

In the memory portion 1, there are provided: an NMOS transistor 3a which is a bulk transistor; and a PMOS transistor 4 which is a thin film transistor. In the peripheral circuit portion 2, there are provided an NMOS transistor 3b and a PMOS transistor 5 both of which are bulk transistors; and an NPN bipolar transistor 6.

In this related art, gate electrodes of the NMOS transistors 3a, 3b and of the PMOS transistor 5 are formed by a first polycrystalline Si layer 12 on an Si base 11, while a base electrode of the NPN bipolar transistor 6 is formed by a second polycrystalline Si layer 13.

Further, both a ground line of the memory portion 1 and an emitter electrode of the NPN bipolar transistor 6 are formed by a third polycrystalline Si layer 14, whereby a simplification of the manufacturing process is intended. A gate electrode of the PMOS transistor 4 and the like are formed by a fourth polycrystalline Si layer 15. An active layer and a power supply line of the PMOS transistor 4 are formed by a fifth polycrystalline Si layer 16.

Contact holes 17 to the Si base 11 and the polycrystalline Si layers 13 and 14 are filled up with plugs consisting of W layers 21. Further, a wiring consisting of a first Al layer 22 is brought into contact with the W layer 21, while a wiring consisting of a second Al layer 23 is brought into contact with the first Al layer 22.

In this related art, the NPN bipolar transistor 6 is of an emitter-base self alignment type. For this reason, an opening portion 25 reaching the Si base 11 is formed continuously both in an SiO$_2$ layer 24 acting as an interlayer insulator on the polycrystalline Si layer 13 as a base electrode and in the polycrystalline Si layer 13; an SiO$_2$ layer 26 deposited all over the surface is anisotropically etched; and thus a sidewall consisting of the SiO$_2$ layer 26 is formed on an inside surface of the opening portion 25 such that a contact hole 27 for the emitter electrode, surrounded by that sidewall, is finally formed.

As is apparent from the above explanation, the SiO$_2$ layer 24 acts not only as an interlayer insulator between the polycrystalline Si layers 13 and 14, but also as an offset when the sidewall consisting of the SiO$_2$ layer 26 is being formed. For this reason, the SiO$_2$ layer 24 must be at least 100 to 200 nm in thickness.

On the other hand, as is apparent from the drawing of the memory portion 1, the SiO$_2$ layer 24 is left on the NMOS transistor 3a of the memory portion 1 and is supposed to be left also on both the NMOS transistor 3b and the PMOS transistor 5 of the peripheral circuit portion 2. For this reason, step of the NMOS transistors 3a and 3b and the PMOS transistor 5 of the memory portion 1 and the peripheral circuit portion 2, respectively, is large and the contact hole 17 is deep.

As a result of this, the contact hole 17 is filled up with the W layer 21 as the plug and, consequently, there arises a decrease in the step coverage of a barrier metal layer (not illustrated in the figure) formed in a lower layer of the W layer 21, even though a break at the step of the Al layer 22 may not arise. This problem becomes problematic especially with a contact hole in relation to a source/drain region of a MOS transistor having a shallow junction: there may result, e.g., a short circuit by an alloy spike between a source/drain region of the NMOS transistor 3b of the peripheral circuit portion 2 and the Si base 11. Accordingly, reliability of the related art shown in FIG. 1 was not always high.

OBJECTS AND SUMMARY OF THE INVENTION

A first object of the present invention is to provide both fast operation and high reliability of a bipolar transistor in a BiMOS semiconductor device.

A second object of the present invention is, in a manufacturing method of BiMOS semiconductor device, to improve reliability of the BiMOS semiconductor device by reducing step in a bipolar transistor portion and a MOS transistor portion.

A BiMOS semiconductor device of the present invention is characterized in that, in a BiMOS semiconductor device comprising a bipolar transistor and a MOS transistor on a same semiconductor base, an emitter electrode is provided on an insulator layer covering a base electrode of the bipolar transistor; and the MOS transistor is not provided with the insulator layer.

A BiMOS semiconductor device of the present invention is characterized in that, in the above-mentioned BiMOS semiconductor device, a gate electrode of the MOS transistor is formed by a first conductive layer on the semiconductor base; the base electrode is formed by a second conductive layer on the semiconductor base; a wiring of the MOS transistor and the emitter electrode are formed by a third conductive layer on the semiconductor base; and the insulator layer is an interlayer insulator formed between the second conductive layer and the third conductive layer.

A BiMOS semiconductor device of the present invention is characterized in that, in the above-mentioned BiMOS semiconductor device, a sidewall comprising a second insulator layer is provided on an inside surface of an opening portion which penetrates both the base electrode and a first insulator layer on the base electrode; the emitter electrode extends inside the sidewall; and the MOS transistor is not provided with the first insulator layer.

A manufacturing method of a BiMOS semiconductor device of the present invention is characterized, on manufacturing any one of the above-mentioned BiMOS semiconductor device, in having the steps of: forming successively a conductive layer for the base electrode and an insulator layer on the conductive layer over the whole surface; and etching the insulator layer at least in the region of the formation of the MOS transistor by setting the end point of the etching at the conductive layer.

As, in a BiMOS semiconductor device of the present invention, no insulator layer electrically isolating the emitter electrode and the base electrode of the bipolar transistor from each other is provided in the MOS transistor, an increase in the step in the MOS transistor due to the insulator layer needs not be considered, i.e., the insulator layer can be made sufficiently thick.

As, in a BiMOS semiconductor device of the present invention, no second conductive layer on the semiconductor base is provided in the MOS transistor, no trouble occurs even when no interlayer insulator is provided between the second and third conductive layers.

In a BiMOS semiconductor device of the present invention, the first and second insulator layers electrically isolate the emitter electrode and the base electrode of the bipolar transistor from each other. As the first insulator layer serves as an offset when the sidewall consisting of the second insulator layer is being formed, the first insulator layer is large in its thickness. The first insulator layer is not provided in the MOS transistor, however. Therefore, the step is small in the MOS transistor.

In a manufacturing method of BiMOS semiconductor device of the present invention, on etching an insulator layer at least in the region of the formation of the MOS transistor, the end point of the etching is set at the conductive layer which has a large etching selectivity to the insulator layer. Therefore, insulator layers below that conductive layer can be prevented from both reduction in thickness and deterioration in quality.

BRIEF DESCRIPTION OF THE DRAWINGS

FIGS. 3A to 3K shows a second embodiment of the present invention, namely of a manufacturing method of a BiMOS semiconductor device of the present invention.

DETAILED DESCRIPTION OF THE PREFERRED EMBODIMENTS

In the following referring to FIGS. 2 and 3, there will be explained first and second embodiments of the present invention which are applied to a BiMOS semiconductor device comprising an emitter-base self alignment type NPN bipolar transistor and an N-channel MOS transistor.

Figure 1:
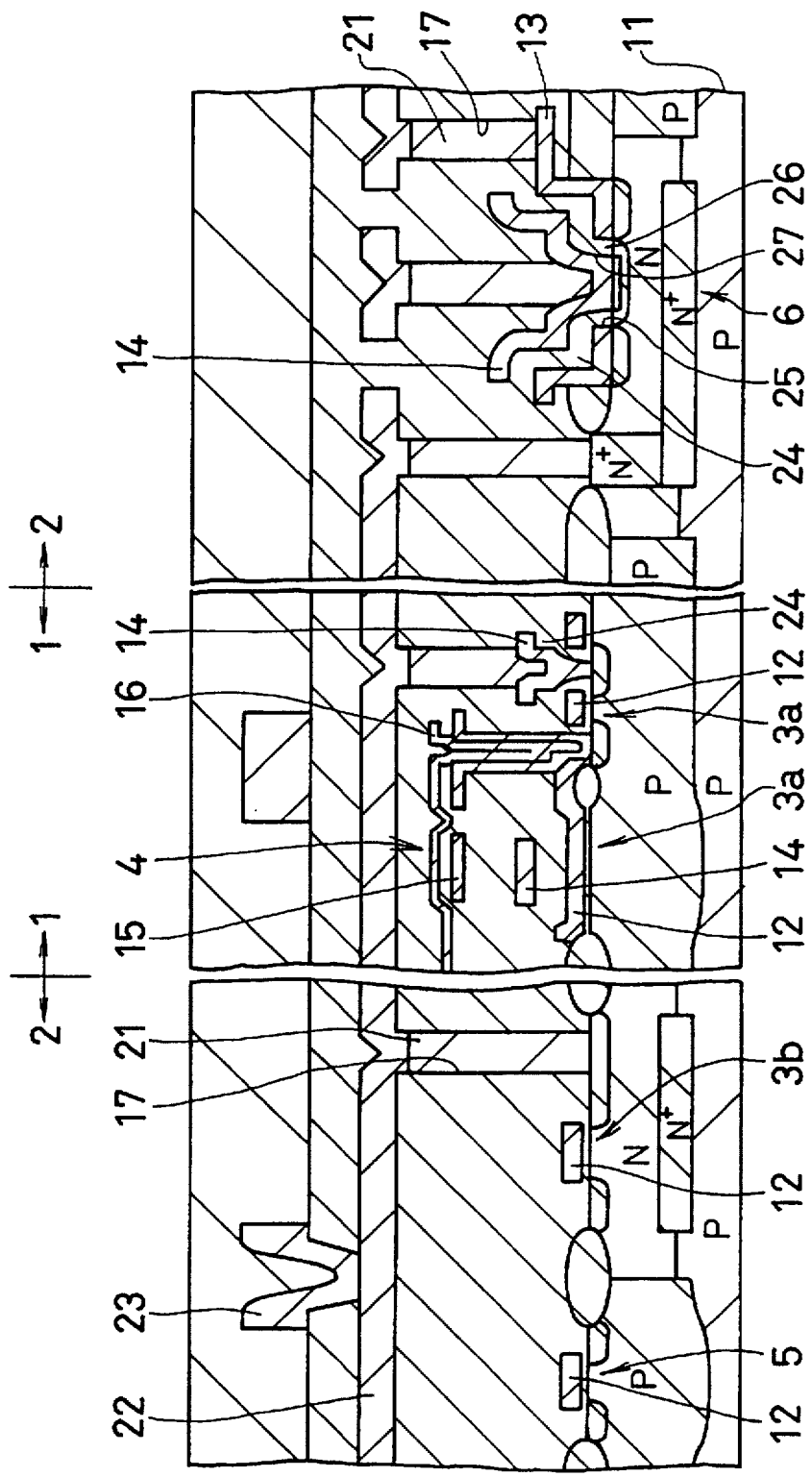
FIG. 1 is a side sectional view of a related art to the present invention.
Figure 2:
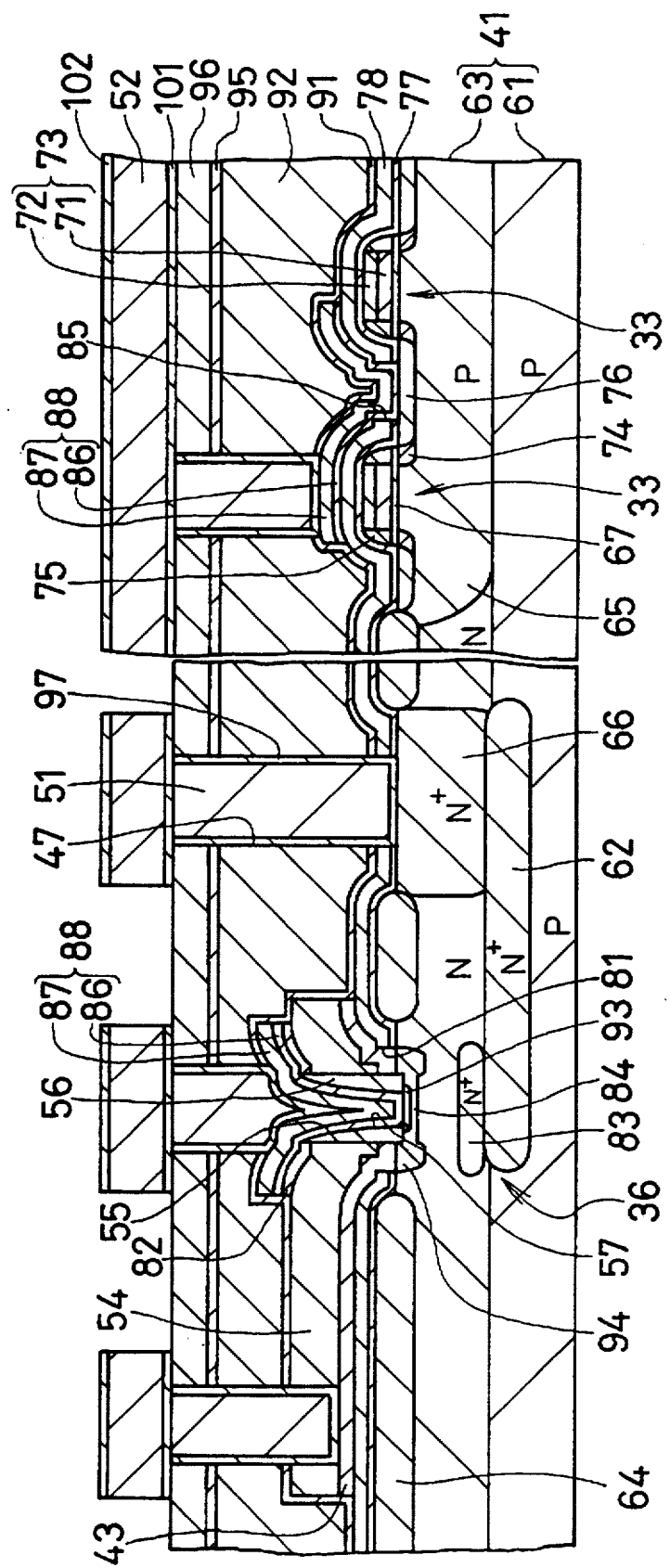
FIG. 2 is a structural sectional view of a first embodiment of a BiMOS semiconductor device of the present invention.

FIG. 2 is a structural sectional view of a first embodiment of a BiMOS semiconductor device of the present invention.

Referring to FIGS. 3A to 3K, there will be explained a second embodiment of the present invention, namely, of a manufacturing method of the above BiMOS semiconductor device.

In the second embodiment, as shown in FIG. 3A, first, an $SiO_2$ layer (not shown in the figure) having a thickness of about 400 nm is formed by thermal oxidation on the surface of a P type Si substrate 61, and an opening portion (not shown in the figure) is formed by selectively etching this $SiO_2$ layer. Then, an $N^+$ type buried layer 62 is formed in the vicinity of the surface of the Si substrate 61 by introducing Sb into the Si substrate 61 by thermal diffusion or ion implantation using the $SiO_2$ layer as a mask.

The Si substrate gets covered by an antimony glass layer at the time of introducing Sb. Therefore, the antimony glass layer and the $SiO_2$ layer are then removed by etching with a buffered hydrofluoric acid or the like. Then, an N type monocrystalline Si layer 63 having a thickness of about 1.5 μm is epitaxially grown on the substrate 61 using a gas such as $SiH_2Cl_2$ with added P or the like so that an Si base 41 is composed of the Si substrate 61 and the monocrystalline Si layer 63.

Next, as shown in FIG. 3B, an $SiO_2$ layer 64 having a thickness of about 400 nm is selectively formed by a LOCOS method on the surface of the Si base 41, whereby an isolation region in which the $SiO_2$ layer 64 is formed is marked off from an active region which is surrounded by the $SiO_2$ layer 64.

Figure 3C:
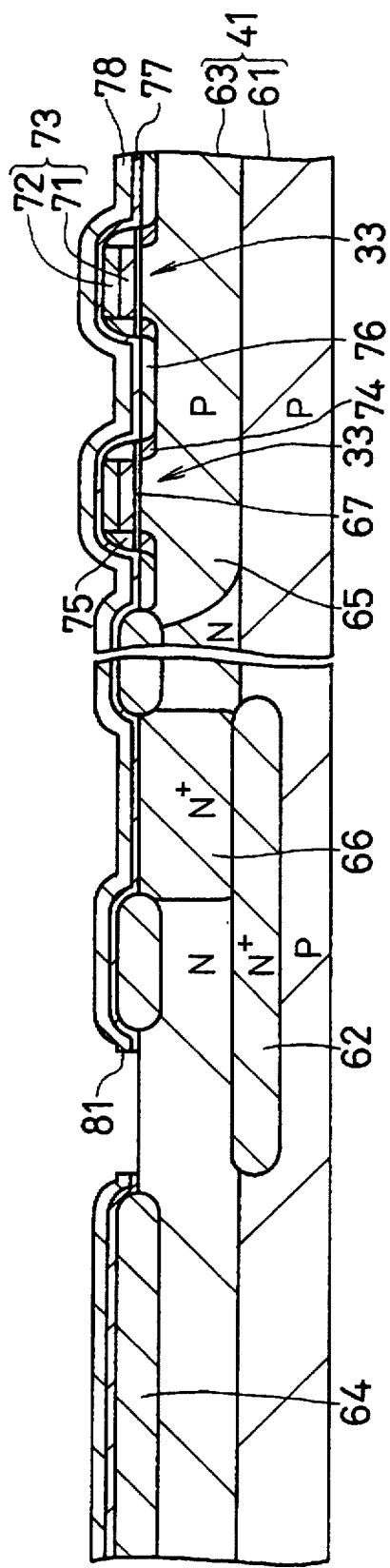

Next, as shown in FIG. 3C, a P well 65 is formed in a region of the formation of an NMOS transistor by selective ion implantation of B into the monocrystalline Si layer 63, while in a region of the formation of an NPN bipolar transistor there is formed a P type impurity region (not shown in the figure) for making a PN junction isolation between the NPN bipolar transistors. An $N^+$ type impurity region 66 is formed as plug region relative to the $N^+$ type buried layer 62 by selective ion implantation of P into the region of the formation of the NPN bipolar transistor.

Thereafter, an $SiO_2$ layer 67 as a gate oxide is formed on the surface of the active region. A polycide layer 73 is formed using CVD method, sputtering method or the like by successively depositing a polycrystalline Si layer 71 and a silicide layer such as WSi layer 72 or the like, their thickness being about 70 to 150 nm. The polycide layer 73 is then worked according to the pattern of the gate electrode of the NMOS transistor.

Thereafter, regions other than the region of the formation of the NMOS transistor are covered by a resist (not shown in the figure), and an N type impurity region 74 is formed by ion implantation of As using as masks the resist as well as the polycide layer 73 and the $SiO_2$ layer 64. By depositing and anisotropically etching the $SiO_2$ layer 75, a sidewall consisting of the $SiO_2$ layer 75 is formed on the side of the polycide layer 73.

Thereafter, the regions other than the region of the formation of the NMOS transistor are again covered by a resist (not shown in the figure), and an $N^+$ type impurity region 76 is formed by ion implantation of As using as masks the resist as well as the polycide layer 73 and the $SiO_2$ layers 64 and 75. By then, an NMOS transistor 33 having an LDD structure is formed. Then, interlayer insulators such as $SiO_2$ layers 77 and 78 or the like are formed, and a contact hole 81 is formed, out of the $SiO_2$ layers 77 and 78, in a portion where the base region of the NPN bipolar transistor is to be formed.

Figure 3D:
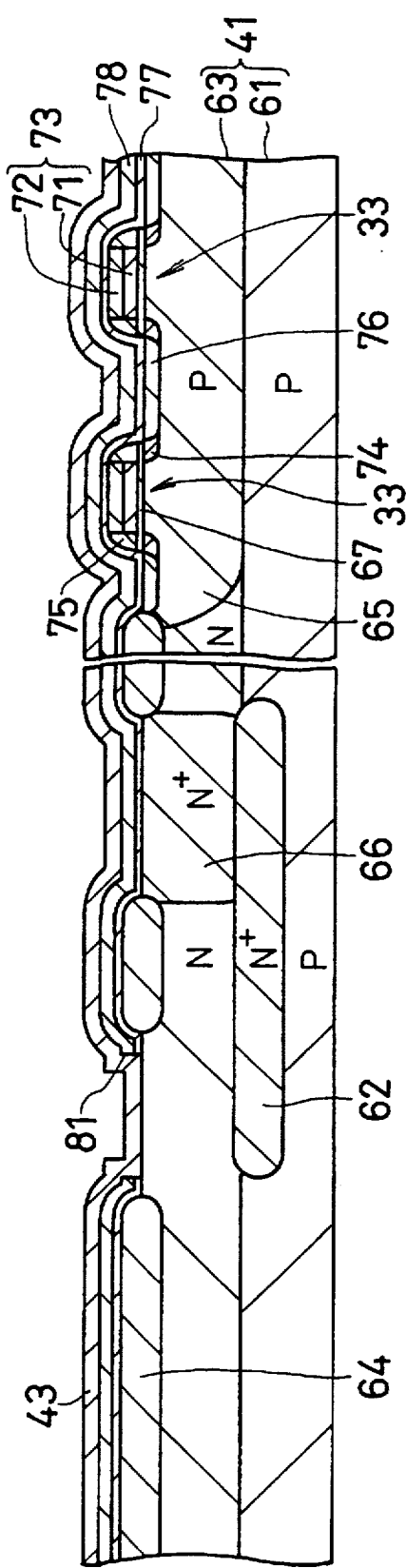

Next, as shown in FIG. 3D, a polycrystalline Si layer 43 having a thickness of about 100 to 200 nm is deposited using a CVD method, and an ion implantation of B into the polycrystalline Si layer 43 is carried out. It is to be noted that, instead of the polycrystalline Si layer 43, a polycide layer may be formed by successively depositing a polycrystalline Si layer having a thickness of about 50 to 100 nm and a silicide layer having a thickness of about 40 to 100 nm using a CVD method, a sputtering method, or the like.

Figure 3E:
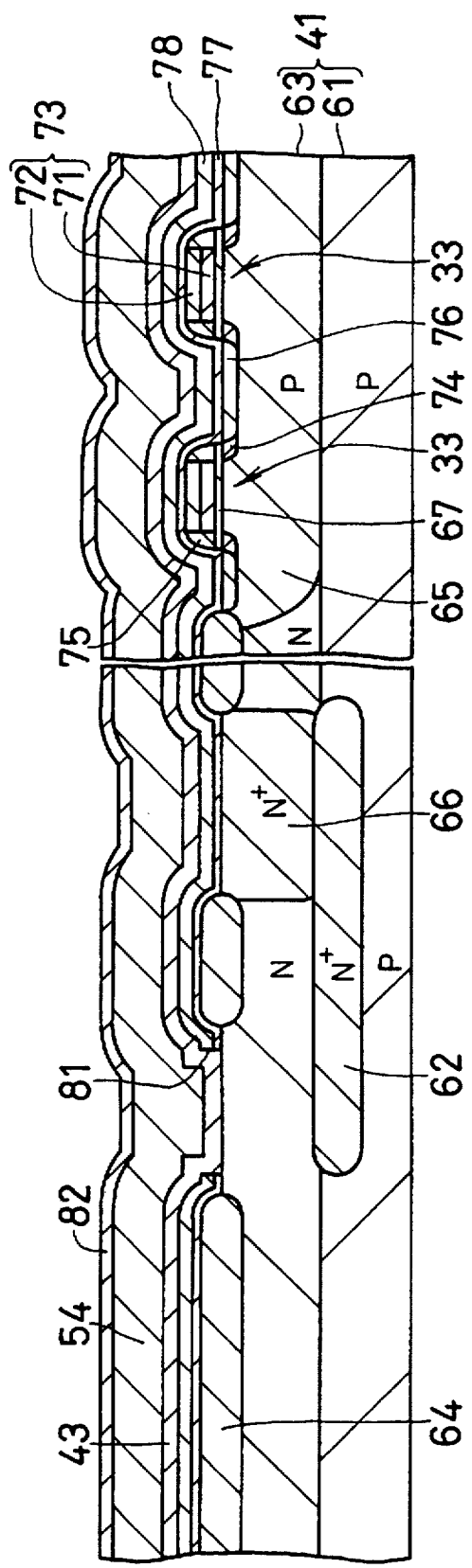
Figure 3F:
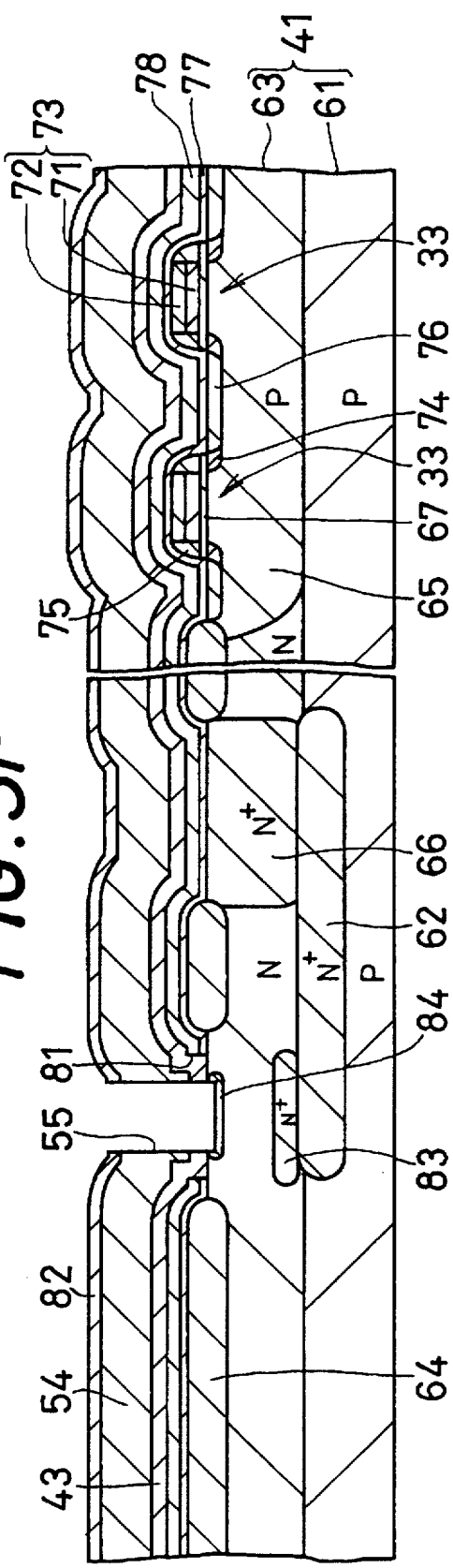

Next, as shown in FIG. 3E, an $SiO_2$ layer 54 having a thickness of about 100 to 200 nm is deposited using TEOS as raw material, and on this $SiO_2$ layer 54, then, a polycrystalline Si layer 82 having a thickness of about 30 to 100 nm is deposited. Thereafter, as shown in FIG. 3F, an opening portion 55 is formed out of the polycrystalline Si layer 82, the $SiO_2$ layer 54 and the polycrystalline Si layer 43, in a portion where an inner base region of the NPN bipolar transistor is to be formed.

Then, by ion implantation of an N type impurity using as a mask the resist (not shown in the figure) once used for the formation of the opening portion 55, an $N^+$ type impurity region 83 for a structure of a selectively implanted collector (SIC) is formed on the $N^+$ type buried layer 62. By ion implantation of B through the opening portion 55, a P type impurity region 84 as an inner base region is formed in a shallow region of the Si base 41.

The ion implantation for the formation of the $N^+$ type impurity region 83 can also be carried out at the time of forming the contact hole 81. In this case, the area of the contact hole 81 is larger than that of the opening portion 55 so that capacitance between the base and the collector increases. As the cross section area for the collector current also increases, the collector current increases.

Next, as shown in FIG. 3G, an $SiO_2$ layer 56 having a thickness of about 100 to 500 nm is deposited by low pressure CVD method using TEOS as a raw material or a well-known conventional atmospheric pressure CVD method. Then, RIE is carried out over the whole surface of the $SiO_2$ layer 56, whereby a sidewall consisting of the $SiO_2$ layer 56 is formed in the inside surface of the opening portion 55 so that a contact hole 57, surrounded by that sidewall, for an emitter electrode is formed. With the RIE of this case, the polycrystalline Si layer 82 acts as stopper and an end point detection is possible with the polycrystalline Si layer 82 so that the sidewall can be formed in a stable fashion.

Next, a resist (not shown in the figure) is worked according to the pattern of the base region and the base electrode of the NPN bipolar transistor, and by using this resist as a mask, the polycrystalline Si layer 82 as a well as the $SiO_2$ layer 54 and the polycrystalline Si layer 43 are continuously etched, as shown in FIG. 3H. On etching the $SiO_2$ layer 54, the polycrystalline Si layer 43 acts as stopper so that the $SiO_2$ layers 77 and 78 as a interlayer insulators in the NMOS transistor 33 and the like are not etched.

Next, as shown in FIG. 3I, there is formed on the $SiO_2$ layers 77 and 78 a contact hole 85 reaching the $N^+$ type impurity region 76 which is a source/drain region shared by two NMOS transistors 33.

Next, as shown in FIG. 3J, a polycrystalline Si layer 86 having a thickness of about 50 to 100 nm is deposited. Ion implantation of As is carried out into the whole surface of the polycrystalline Si layer 86, and thereafter, by depositing a WSi layer 87 having a thickness of about 50 to 100 nm, a polycide layer 88 is formed. By patterning the polycide layer 88, an emitter electrode is formed in the region of the formation of the NPN bipolar transistor, while a deriving electrode from the $N^+$ type impurity region 76 is formed in the NMOS transistors 33.

Figure 3K:
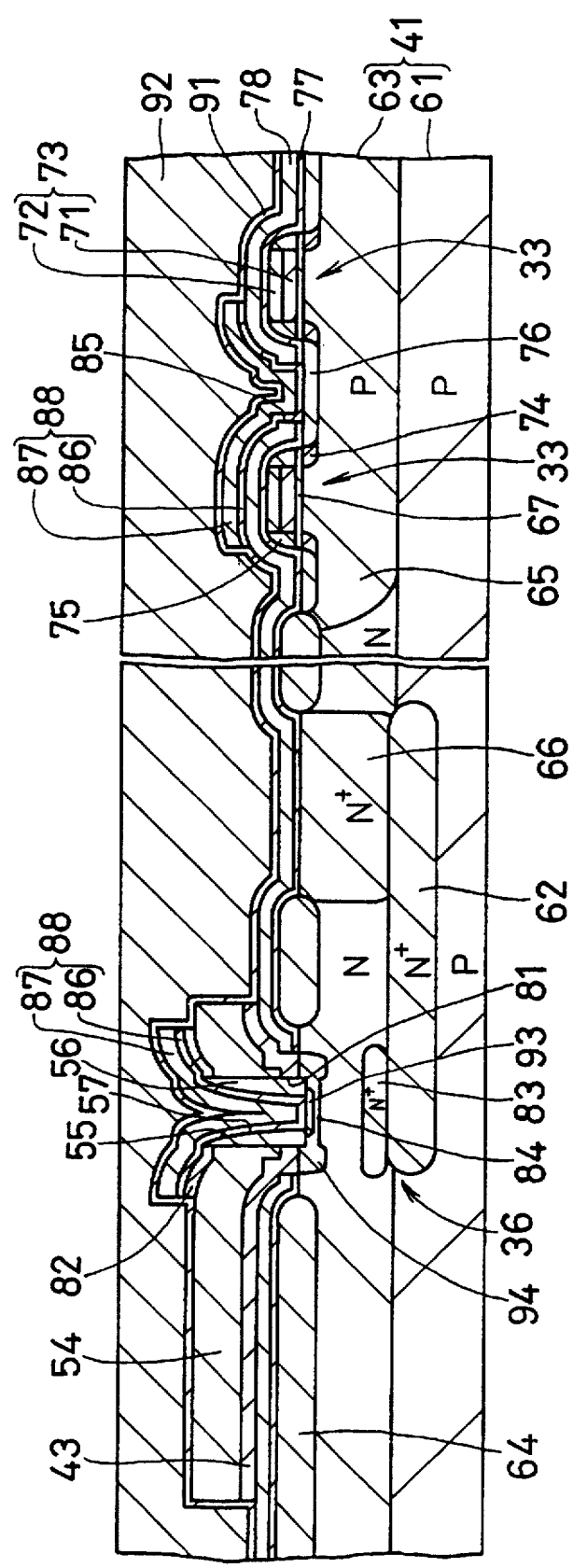

Next, as shown in FIG. 3K, $SiO_2$ layers 91 and 92 or the like as interlayer insulators are formed, and then by annealing, solid phase diffusion of As is effected from the polycrystalline Si layer 86 into the Si base 41 such that an $N^+$ type impurity region 93 is formed as an emitter region, while solid phase diffusion of B is effected from the polycrystalline Si layer 43 into the Si base 41 such that a $P^+$ type impurity region 94 is formed as an outer base region. By now an emitter-base self alignment type NPN bipolar transistor 36 is formed.

Next, wirings are formed by polycide layers (not shown in the figure) or the like, and thereafter, $SiO_2$ layers 95 and 96 or the like as interlayer insulators are formed as shown in FIG. 2, and a contact hole 47 is selectively formed. The contact hole 47 is then filled by a plug consisting of a Ti/TiN layer 97 or the like and a W layer 51 as barrier metal layer and closely contacting layer.

Thereafter, by patterning a Ti/TiN layer 101 or the like as barrier metal layer or the like, a Cu-containing Al layer 52 and a Ti/TiN layer 102 or the like as antireflection layer or the like, a first laminated Al wiring is formed. Further, an interlayer insulator (not shown in the figure) and a second laminated Al wiring (not shown in the figure) are formed, and thereafter, by forming an SiN layer (not shown in the figure) as a overcoat layer using a plasma CVD method, the present embodiments are completed.

In the above embodiments, the NPN bipolar transistor 36 is of an emitter-base self alignment type. The invention of the present application can, however, also be applied to a BiMOS semiconductor device having a non-emitter-base self alignment type bipolar transistor and its manufacturing method.

In a BiMOS semiconductor device of the present invention, there can be made sufficiently thick an insulation layer which electrically isolates an emitter electrode and a base electrode of a bipolar transistor from each other. Therefore, operation of the bipolar transistor can be made faster by reducing interwiring capacitance between the emitter electrode and the base electrode, while reliability of the bipolar transistor can be increased by raising the interlayer breakdown voltage between the emitter electrode and the base electrode.

In a BiMOS semiconductor device of the present invention, no trouble occurs even when no interlayer insulator is provided between the second and third conductive layers on the semiconductor base in the MOS transistor. Therefore, both fast operation and high reliability of the bipolar transistor can be achieved without hindrance.

In a BiMOS semiconductor device of the present invention, while fast operation and high reliability of the bipolar transistor are achieved, reduction in reliability of the MOS transistor by a wiring break at the step, an alloy spike and the like can be prevented due to a small step of the MOS transistor.

In a manufacturing method of BIMOS semiconductor device of the present invention, insulator layers in the region of the formation of the MOS transistor can be prevented from both reduction in thickness and deterioration in quality. Thus, a BiMOS semiconductor device comprising a highly reliable bipolar transistor fast in operation and a highly reliable MOS transistor can be manufactured.

What is claimed is:

1. A manufacturing method of BiMOS semiconductor device comprising a bipolar transistor and a MOS transistor in a common semiconductor base, comprising the steps of:

forming at least one MOS transistor transistor on the semiconductor base;

forming a first insulator layer over the MOS transistor and over a first region of the bipolar transistor;

forming a contact opening in the first insulator layer;

forming a first electrode for the first region of the bipolar transistor in the contact opening, the first electrode being an etching stopper layer;

forming a second insulator layer covering the contact opening and the first electrode;

forming an opening portion in the second insulator, the opening portion being contained within the contact opening;

forming a sidewall within said opening portion; and forming a second electrode within the opening portion over the sidewall;

wherein the second insulator layer does not extend over the MOS transistor.

2. The manufacturing method of BiMOS semiconductor device according to claim 1, wherein said etching stopper layer comprises a semiconductor layer.

3. The manufacturing method of BiMOS semiconductor device according to claim 1, wherein the etching stopper layer comprises a base electrode.

4. The manufacturing method of BiMOS semiconductor device according to claim 1, wherein the etching stopper layer comprises a polycrystalline Si layer on a base electrode.

5. The method as set forth in claim 1, wherein the step of forming the second insulator layer comprises a step of forming the second insulator layer over the MOS transistor and the method further comprises a step of etching the second insulator layer from the MOS transistor.

6. The method as set forth in claim 5, wherein the step of etching comprises a step of using the first electrode as the etching stopper layer.

7. The method as set forth in claim 5, wherein the step of forming the first insulator layer comprises a step of forming a pair of interlayer insulators.

8. The method as set forth in claim 5, wherein the step of forming the first electrode comprises a step of forming a base electrode.

9. The method as set forth in claim 5, wherein the step of forming the second electrode comprises a step of forming an emitter electrode.

* * * * *